(12) United States Patent
Hsiao

(10) Patent No.: US 6,303,519 B1
(45) Date of Patent: Oct. 16, 2001

(54) METHOD OF MAKING LOW K FLUORINATED SILICON OXIDE

(75) Inventor: Chih-Hsiang Hsiao, Taipei (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/620,238

(22) Filed: Jul. 20, 2000

(51) Int. Cl.$^7$ .................................................... H01L 21/31
(52) U.S. Cl. ...................... 438/758; 427/579; 438/783; 438/784; 438/788
(58) Field of Search .............................. 427/579; 438/758, 438/624, 763, 783, 784, 788

(56) References Cited

U.S. PATENT DOCUMENTS

| | | | |
|---|---|---|---|
| 5,563,105 | * 10/1996 | Dobuzinsky et al. | 438/734 |
| 5,660,895 | * 8/1997 | Lee et al. | 427/579 |
| 6,121,162 | * 9/2000 | Endo | 438/787 |

OTHER PUBLICATIONS

Shannon et al., "Study of the material properties and suitability of plasma deposited fluorine–doped silicon dioxides for low dielectric constant interlevel dielectrics", Thin Solid Films, 270 (1995) 498–502.*

Shapiro et al., "CVD of fluorosilicate glass for ULSI applications", Thin Solid Films, 20 (1995) 503–507.*

Chang et al., "A manufacturable and reliable low–k inter--metal dielectric using fluorinated oxide (FSG)", IEEE Inter. Conf. on Interconnect Tech, 1999, 131–133.*

Barth et al., "Integration of copper and fluorosilicate glass for 0.18 $\mu$m interconnections", Proc. of the 2000 Inter. Interconnect Tech. Conf., 2000, 219–221.*

* cited by examiner

Primary Examiner—Richard Elms
Assistant Examiner—Christian D. Wilson
(74) Attorney, Agent, or Firm—Winston Hsu

(57) ABSTRACT

A method of forming a fluorinated silicon oxide layer or an FSG film having a dielectric constant less than 3.2 is disclosed. The method includes introducing a fluorine-rich gas into a reacting chamber, introducing an oxygen-rich gas into the reacting chamber, creating a plasma environment in the reacting chamber to deposit the FSG film, and adjusting the flow rate of the oxygen-rich gas till the ratio of the flow rate of the oxygen-rich gas to the total flow rate of the fluorine-rich gas and silicon-rich gas is less than or equal to a pre-selected value to form the FSG film. The refraction index (RI) of the fluorinated silicon oxide layer must be greater than or equal to 1.46.

17 Claims, 3 Drawing Sheets

METHOD OF MAKING LOW K FLUORINATED SILICON OXIDE

BACKGROUND OF THE INVENTION

1. Field of the Invention

The present invention relates to a method of forming a fluorinated silicon oxide layer with a low dielectric constant during wafer processing. More particularly, the present invention relates to a deposition method for making a fluorinated silicon oxide layer having a dielectric constant that can be reduced to less than or equal to 3.

2. Description of the Prior Art

As feature sizes shrink and the integration of integrated circuits (IC) increases, resistance-capacitance (RC) time delays are becoming one of the most critical issues of IC industry. RC time delays are caused by adjacent metallic wiring lines in which each line is carrying an electric current, and it is a serious problem in multi-level metallization processes for manufacturing integrated circuits. Disadvantageously, RC time delays usually lead to reduced response, increased device power consumption and poor electrical performance of an IC. The response and performance become worse as the spacing between two adjacent metallic wiring lines decreases.

RC time delays are a product of the resistance R of the metallic wiring lines and the parasitic capacitance C formed between them. Minimal RC time delays are desirable. In essence, there are two approaches for deducing RC time delays: a) using conductive materials with a lower resistance as a wiring line or, b) reducing the parasitic capacitance.

Obviously, copper is a good choice for a conductor owing to its low resistance (1.67-cm) over Al—Cu(5%) alloy, which is the most commonly used conductor in current multilevel metallization processes. However, with the ever-increasing demand on performance, changing the metallic material appears to be inadequate to support future requirements. Consequently, some organic dielectric materials with low dielectric constants, such as polyimide (PI) and HSQ (hydrogen silsequioxane) etc., are rapidly coming into use to reduce parasitic capacitance. Unfortunately, most organic dielectric materials have metal adhesion issues and stability problems in a thermally active environment.

Since they are without the above-mentioned problems, low K inorganic materials are particularly desirable for intermetal dielectric (IMD) layers to reduce the RC time delay of an interconnect metallization circuit, to prevent cross talk between the different levels of metallization. Presently, many approaches for obtaining lower dielectric constants have been proposed. One of the more promising solutions is the incorporation of fluorine into a silicon oxide layer, also known as fluorinated silicon glass (FSG) films. A variety of different precursor gases and liquids have been employed as the source of fluorine in the formation of these FSG films. Some of these precursors include $NF_3$, HF, $SF_6$, $CF_4$, $C_2F_6$, $C_2Cl_3F_3$ and triethoxyfluorosilane (TEFS).

Please refer to FIG. 1A and FIG. 1B. FIG. 1A and FIG. 1B are diagrams illustrating, respectively, the dielectric constant (K) versus fluorine percentage in an FSG film, and the refraction index (RI) versus fluorine percentage. In FIG. 1A, the dielectric constant of an undoped silicon glass (USG) is about 3.9. Basically, as the concentration of the incorporated fluorine increases, the dielectric constants of FSG films decreases. However, the reported lowest stable dielectric constants can be achieved only down to about 3.5 to 3.2 according to the prior art method. As shown in FIG. 1B, as the fluorine percentage increases the RI decreases. The RI of an USG film is about 1.456.

It should be noted that none of the existing methods for preparing FSG films are capable of making a film having a stable dielectric constant that is less than 3.2. Additionally, some poorly formed FSG films may absorb moisture from the atmosphere, or from the reaction products associated with the deposition process. The absorption of water raises the dielectric constant of the FSG films.

SUMMARY OF THE INVENTION

It is therefore a primary objective of the present invention to provide a method of making a low K FSG film.

Another objective of the present invention is to provide a method of making an FSG film having a stable dielectric constant that is less than or equal to 3.2.

Still another objective of the present invention is to provide a method for depositing an FSG film that has reduced water and moisture absorptivities.

Still another objective of the present invention is to provide a CVD method for depositing an FSG film having a dielectric constant that is less than 3.2 by controlling the RI and O/F ratio.

The present invention provides a method of forming a fluorinated silicon oxide layer or an FSG film on a semiconductor wafer. In accordance with the present invention, the semiconductor wafer is first placed in a reacting chamber. The method includes introducing a fluorine-rich gas into the reacting chamber, introducing an oxygen-rich gas into the reacting chamber, creating a plasma environment in the reacting chamber to deposit fluorinated silicon oxide on the semiconductor wafer, and adjusting the flow rate of the oxygen-rich gas till the ratio of the flow rate of the oxygen-rich gas to the total flow rate of the fluorine-rich gas and silicon-rich gas is less than or equal to a pre-selected value to form the fluorinated silicon oxide layer. The refraction index (RI) of the fluorinated silicon oxide layer must be greater than or equal to 1.46. The initial flow rate of the oxygen-rich gas is greater than that of the fluorine-rich gas but less than twice the initial flow rate of the fluorine-rich gas. The plasma environment may be a high-density plasma.

In a preferred embodiment of the present invention, the fluorine-rich gas comprises $SiF_4$ and a silicon-rich gas. The silicon-rich gas is comprised of silane, or tetra-ethoxysilane (TEOS). The oxygen-rich gas is ultra-purified oxygen. Argon or helium are introduced into the reacting chamber as a carrier gas. By adjusting the flow rate of the oxygen gas to meet that the ratio of the flow rate of the oxygen gas to the total flow rate of the fluorine-rich gas, which is less than or equal to 2, the pre-selected value of oxygen to fluorine (O/F) ratio can be obtained. The plasma environment is created under the following conditions: (1) a top power of 700 to 5000 W; (2) a temperature of 300 to 500 j ;and (3) a pressure of 3 mtorr to 10 torr.

DETAILED DESCRIPTION OF THE PREFERRED EMBODIMENT

Figure 1A:
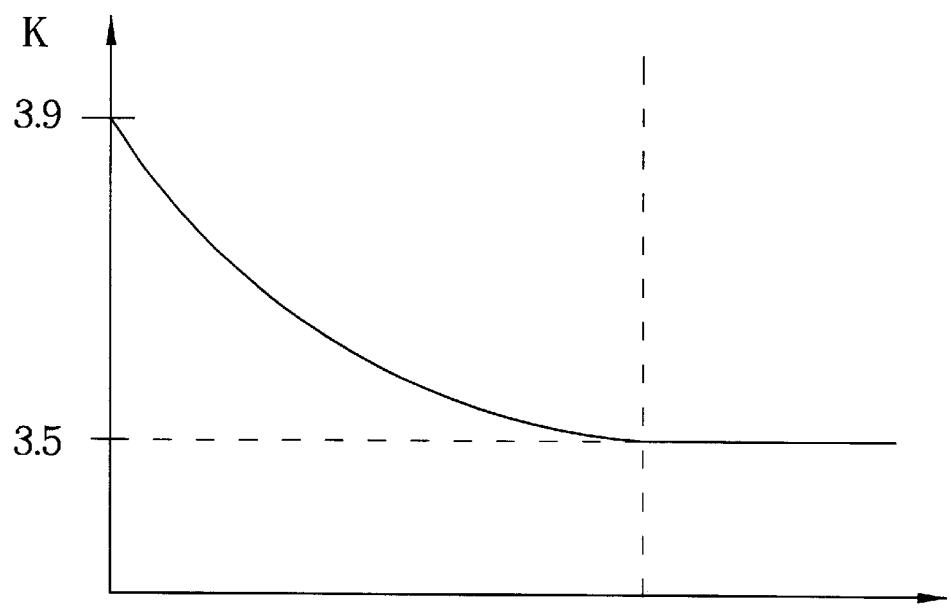
FIG. 1A is a diagram illustrating dielectric constant (K) versus fluorine percentage in an FSG film according to the prior art method.
Figure 1B:
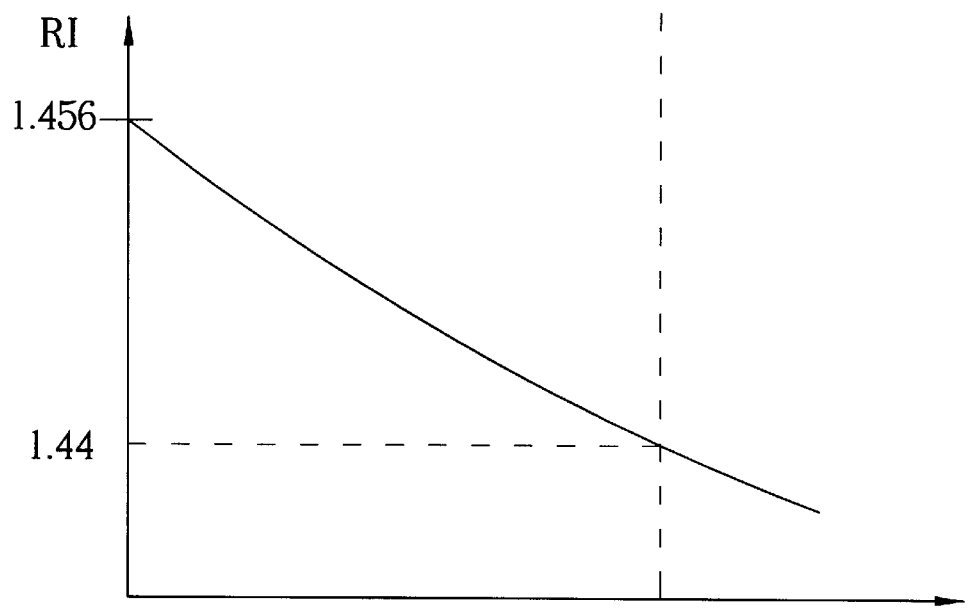
FIG. 1B is a diagram illustrating refraction index (RI) versus fluorine percentage according to the prior art method.
Figure 2:
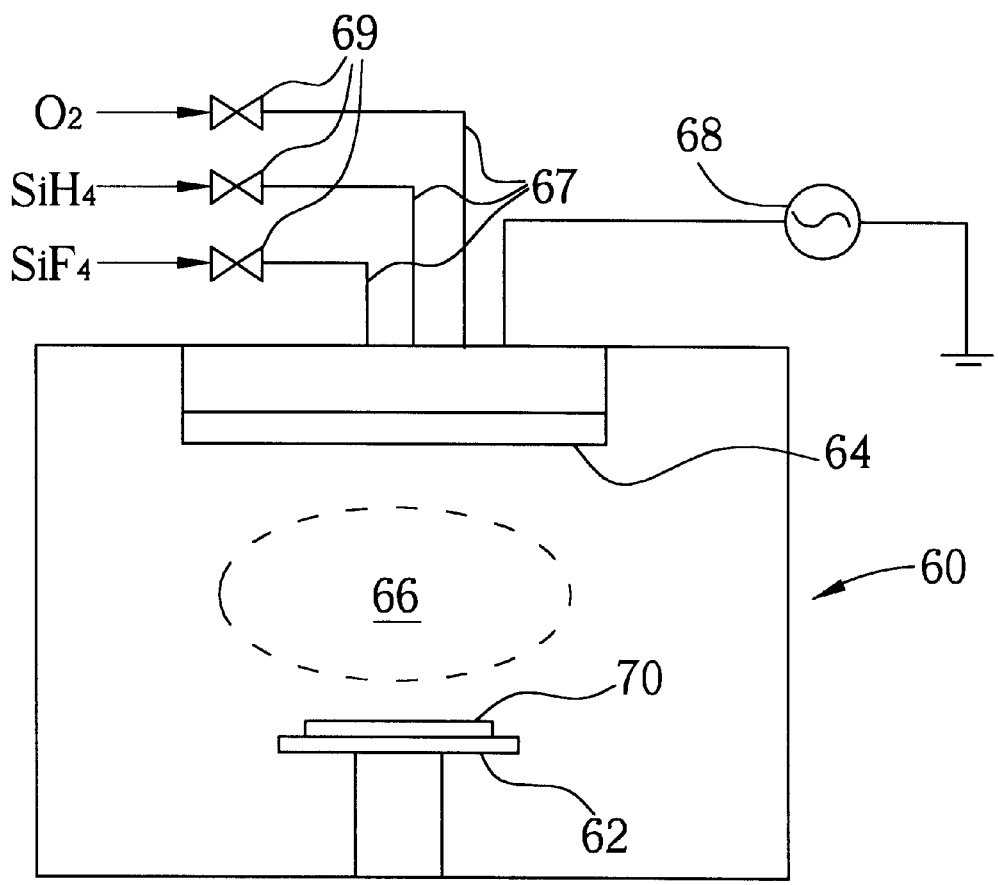
FIG. 2 is a schematic diagram showing a CVD reacting chamber according to the present invention.

Please refer to FIG. 2. FIG. 2 is a schematic diagram showing a CVD reacting chamber 60 according to the present invention. In FIG. 2, the reacting chamber 60 is hermetically sealed and comprises a top electrode 64, and a wafer holder 62 that is used to support a semiconductor wafer 70. The top electrode 64 provides 13.56 MHz radio frequency (RF) electromagnetic radiation so as to excite the process gas mixture introduced into the chamber 60, and thus induce a plasma 66 over the semiconductor wafer 70. The 13.56 MHz RF radiation is produced by a top power RF generator 68 that is electrically coupled to the top electrode 64. $SiF_4$, $SiH_4$ and ultra-purified oxygen are introduced respectively through conduit lines 67, and each gas flow is carefully controlled by control valves 69 that are electrically connected to a mass flow controller (MFC) (not explicitly shown). Some gases, such as argon or helium, which act as a carrier gas, are also introduced into the reacting chamber 60 in this embodiment.

The above reacting chamber 60 description is mainly for illustrative purposes. Variations of the above-described system, such as plasma-enhanced chemical vapor deposition (PECVD) chambers or high-density plasma chemical vapor deposition (HDP CVD) chambers, are also suitable for this invention. It should be noted that the present invention is not limited to any specific CVD apparatus.

Depending upon different types of CVD systems, plasma conditions, and deposition rates, the total flow rate of $SiF_4$ and $SiH_4$ should be previously determined. According to the present invention, a gas mixture of $SiF_4$ and $SiH_4$ with a total flow rate of 90 sccm (standard cubic centimeters per minute) is first introduced into the reacting chamber 60, wherein the flow rate of $SiH_4$ is between 0 to 200 sccm. The flow rate of this gas mixture can be finely controlled by virtue of the MFC to within a range of from 5 to 300 sccm. However, the flow rate of the gas mixture is not restricted to 90 sccm. In other words, the total flow rate of the gas mixture of $SiF_4$ and $SiH_4$ may be 300 to 400 sccm only if the MFC can precisely control the flow rate.

After fixing the total flow rate of $SiF_4$ and $SiH_4$ at 90 sccm, ultra-purified oxygen with an initial flow rate of 155 sccm (greater than the total flow rate of $SiF_4$ and $SiH_4$ but less than twice of that) is subsequently introduced into the reacting chamber 60. By controlling the ratio of the flow rate of the ultra-purified oxygen to the total flow rate of $SiF_4$ and $SiH_4$ the oxygen to fluorine (O/F) ratio can be controlled at a pre-selected value that ranges between 1.5 and 4.5.

Next, a plasma environment 66 is created in the reacting chamber 60 under the following conditions: 1) a top power of 700 to 5000 W; 2) a temperature of 300 to 500° C.; and 3) a pressure of 3 mtorr to 10 torr. Under these process conditions, the activated species of the plasma 66 that consists of oxygen, $SiF_4$ and $SiH_4$ directly bombard the surface of the semiconductor wafer 70 and begin to deposit an FSG film. The resulting RI of the FSG film is about 1.5, which is greater than the RI of USG (RI=1.456). The RI of the FSG film is measured using a known measurement technique in the art.

In table 1 below, different results of K and RI of FSG films corresponding to decreasing oxygen flow rates are summarized (at a total flow rate of $SiF_4$ and $SiH_4$ equal to 90 sccm). Once we obtain an FSG film having an RI greater than 1.46, K decreases as the oxygen flow rate decreases (when other process parameters are fixed). As shown in table 1, when the oxygen flow rate is maintained at 135 sccm, K is about 3.29. It is believed that fluorine lowers the dielectric constant of the silicon oxide layer because fluorine is an electronegative atom that decreases the polarizability of the overall fluorinated silicon oxide network. Not shown in table 1, but which has been tested, is that when the oxygen flow rate continues to be decreased, K can be lowered to below 3.

TABLE 1

| oxygen flow rate (sccm) | K | RI |
| --- | --- | --- |
| 155 | 3.3838 | 1.5076 |
| 145 | 3.2984 | 1.4998 |
| 135 | 3.2897 | 1.5029 |

It should be noted that in addition to the oxygen flow rate, the RI of the FSG film also relates to other process parameters, such as the total flow rate of $SiF_4$ and $SiH_4$, top power, temperature, and pressure etc. Thus, all process parameters excepting the oxygen flow rate should be kept fixed during the entire process to obtain an RI that is greater than 1.46.

Figure 3:
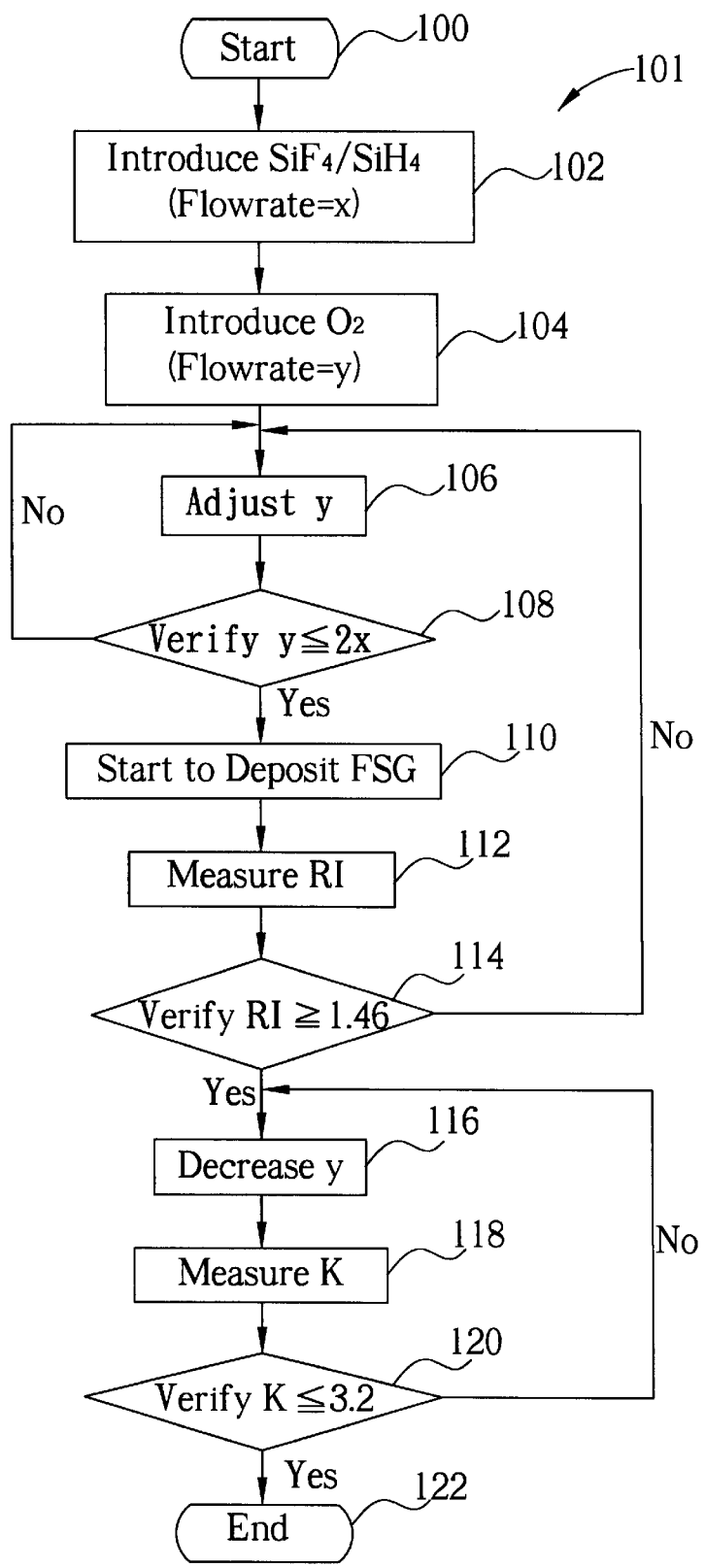
FIG. 3 depicts a process flow chart of the preferred embodiment according to the present invention.

From the above, a process flow chart 101 can be deduced according to the present invention. Please refer to FIG. 3. FIG. 3 depicts the process flow chart 101 that is used to form an FSG film with K less than or equal to 3.2. In FIG. 3, before implementing step 100, a CVD reacting camber described above is first provided. The process may be performed on specimen wafers from steps 100 to 114. In step 102, $SiF_4$ and $SiH_4$ with a total flow rate x that is controlled by an MFC are introduced into the chamber. In other embodiments, $SiF_4$ may be substituted by $C_2F_6$, $CF_4$, or triethoxyfluorosilane (TEFS). As noted, the total flow rate of $SiF_4$ and $SiH_4$ should be previously determined depending on the deposition rate, type of CVD system, and plasma conditions.

In step 104, ultra-purified oxygen with a flow rate y is subsequently introduced into the chamber. The initial flow rate of oxygen is greater than the total flow rate of $SiF_4$ and $SiH_4$. In one embodiment, the oxygen may be substituted with nitrous oxide ($N_2O$). Next, in step 106, the flow rate y is adjusted. More specifically, the flow rate y is decreased in step 106 in this preferred embodiment. Most importantly, the flow rate y should be less than or equal to twice of the total flow rate x. The verifying step is implemented in step 108. After fixing y, step 110 is performed to begin depositing the FSG film.

After finishing step 110, the RI of the FSG film is measured using a known measuring method in the art (step 112). The measured RI should be greater than or equal to 1.46 (step 114). If RI of the FSG film is less than 1.46 the process goes back to step 106. It should be noted that the formed FSG film (illustrated in from steps 100 to 114) must agree with the two rules, i.e. (a) an RI greater than or equal to 1.46 and (b) the flow rate y less than or equal to twice the total flow rate x.

Next, the following steps 116 to 122 may be implemented on the same semiconductor wafer or on another wafer. After implementing the verifying step 114, all of the process parameters except the oxygen flow rate y are fixed. The flow rate y is decreased by a constant value of about 10 sccm each time (step 116). This constant value, however, may be any other value, as desired. For each resulting FSG film, a new dielectric constant K is measured using a known skill in the art (step 118). If K is greater than 3.2 then the process goes back to step 116. The process does not end (step 122) until the loop from 116 to 120 returns (step 120) with a positive result.

Compared to the prior art method of forming an FSG film on a semiconductor wafer, the present invention provides a method of making an FSG film with a K that is less than 3.2, or even less than 3. The flow rate of the oxygen-rich gas to the flow rate of the fluorine-rich gas is less than or equal to 2 so that the O/F ratio in the reacting chamber is less than or equal to a pre-selected value. The formed FSG film must have an RI greater than or equal to 1.46. By simply decreasing the flow rate of the oxygen-rich gas, an FSG film with a dielectric constant less than 3 is obtained. The present invention is completely compatible with existing CVD processes, and so total overhead costs can be reduced. Furthermore, the formed FSG film according to the present invention has superior thermal stability qualities, and is not prone to moisture absorption.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a fluorinated silicon oxide layer on a semiconductor wafer, the method comprising:

providing a reacting chamber, the semiconductor wafer being placed into the reacting chamber;

introducing a fluorine-rich gas and a silicon-rich gas into the reacting chamber;

introducing an oxygen-rich gas into the reacting chamber and performing a first adjusting circulation including the steps of (1) adjusting the flow rate of the oxygen-rich gas and (2) verifying the ratio of the flow rate of the oxygen-rich gas to the fluorine-rich gas being less than or equal to 2;

creating a plasma environment in the reacting chamber to deposit fluorinated silicon oxide on the semiconductor wafer;

performing a second adjusting circulation for measuring and verifying the refraction index (RI) of the deposited fluorinated silicon oxide layer being greater than or equal to 1.46, if not, repeating the first adjusting circulation; and when the RI being greater than or equal to 1.46, performing a third adjusting circulation for adjusting the flow rate of the oxygen-rich gas till the oxygen to fluorine (O/F) ratio is less than or equal to a pre-selected value to form the deposited fluorinated silicon oxide layer, measuring and verifying the dielectric constant of the fluorinated silicon oxide layer is less than or equal to 3.

2. The method of claim 1 wherein the silicon-rich gas is comprised of silane, or tetra-ethoxysilane (TEOS).

3. The method of claim 2 wherein the flow rate of the silane is between 0 to 200 sccm (standard cubic centimeters per minute).

4. The method of claim 1 wherein the fluorine-rich gas is comprised of $SiF_4$, $C_2F_6$, $CF_4$, or triethoxyfluorosilane (TEFS).

5. The method of claim 1 wherein the oxygen-rich gas is comprised of oxygen or nitrous oxide ($N_2O$).

6. The method of claim 1 wherein the plasma environment is created under the following conditions: (1) a top power of 700 to 5000 W; (2) a temperature of 300 to 500° C.; and (3) a pressure of 3 mtorr to 10 torr.

7. The method of claim 1 wherein argon or helium are introduced into the reacting chamber.

8. The method of claim 1 wherein the pre-selected value is between 1.5 and 4.5.

9. A method of making a fluorinated silicon oxide layer having a dielectric constant that is less than or equal to 3 on a semiconductor wafer, the method comprising:

providing a reacting chamber, the semiconductor wafer being placed into the reacting chamber;

introducing a fluorine-rich gas and a silicon-rich gas into the reacting chamber;

introducing an oxygen-rich gas into the reacting chamber, and performing a first adjusting circulation to verify the ratio of the flow rate of the oxygen-rich gas being equal to or less than double that of the fluorine-rich gas;

creating a plasma environment in the reacting chamber to deposit fluorinated silicon oxide on the semiconductor wafer, and performing a second adjusting circulation to verify the refraction index (RI) of the fluorinated silicon oxide layer being greater than or equal to 1.46; and when the RI being greater than or equal to 1.46, performing a third adjusting circulation to the ratio of the flow rate of the oxygen-rich gas to the total flow rate of the fluorine-rich gas and silicon-rich gas is less than or equal to 2 to form the fluorinated silicon oxide layer.

10. The method of claim 9 wherein the first adjusting circulation comprises of adjusting the flow rate of the oxygen-rich gas and a verifying step.

11. The method of claim 9 wherein the silicon-rich gas is comprised of silane or TEOS.

12. The method of claim 9 wherein the fluorine-rich gas is comprised of $SiF_4$, $C_2F_6$, $CF_4$, or TEFS.

13. The method of claim 9 wherein the oxygen-rich gas is comprised of oxygen or $N_2O$.

14. The method of claim 9 wherein the plasma environment is created under the following conditions: (1) a top power of 700 to 5000 W; (2) a temperature of 300 to 500° C.; and (3) a pressure of 3 mtorr to 10 torr.

15. The method of claim 9 wherein argon or helium are introduced into the reacting chamber.

16. The method of claim 9 wherein the second adjusting circulation comprises of measuring and verifying the refraction index of the fluorinated silicon oxide layer being greater than or equal to 1.46, if not, repeating the first adjusting circulation.

17. The method of claim 9 wherein the third adjusting circulation comprises of adjusting the flow rate of the oxygen-rich gas, measuring and verifying the dielectric constant of the fluorinated silicon oxide layer that is less than or equal to 3.

* * * * *